(12) United States Patent
Zhang et al.

(10) Patent No.: US 9,832,553 B2
(45) Date of Patent: Nov. 28, 2017

(54) OPTICAL INTERCONNECTION SYSTEM AND METHOD

(71) Applicant: Huawei Technologies Co., Ltd., Shenzhen (CN)

(72) Inventors: Jiayong Zhang, Shenzhen (CN); Qinfen Hao, Beijing (CN); Yaoda Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 27 days.

(21) Appl. No.: 15/189,746

(22) Filed: Jun. 22, 2016

(65) Prior Publication Data

US 2016/0301995 A1  Oct. 13, 2016

Related U.S. Application Data

(63) Continuation of application No. PCT/CN2014/093936, filed on Dec. 16, 2014.

(30) Foreign Application Priority Data

Dec. 23, 2013 (CN) .......................... 2013 1 0717025

(51) Int. Cl.
   *H04J 14/00* (2006.01)
   *H04Q 11/00* (2006.01)
   (Continued)

(52) U.S. Cl.
   CPC ..... *H04Q 11/0062* (2013.01); *G02B 6/12002* (2013.01); *G02B 6/12004* (2013.01);
   (Continued)

(58) Field of Classification Search
   CPC ....... H04Q 11/0062; H04Q 2011/0052; H04Q 2011/005; G02B 6/43; G02B 6/12002;
   (Continued)

(56) References Cited

U.S. PATENT DOCUMENTS 5,416,861 A * 5/1995 Koh ................... G02B 6/12007
                                                                    385/14
6,690,845 B1   2/2004 Yoshimura et al.
(Continued)

FOREIGN PATENT DOCUMENTS

CN  101836290 A  9/2010
CN  103081102 A  5/2013
(Continued)

OTHER PUBLICATIONS

Foreign Communication From A Counterpart Application, European Application No. 14873307.4, Extended European Search Report dated Nov. 25, 2016, 9 pages.
(Continued)

*Primary Examiner* — Tesfaldet Bocure
(74) *Attorney, Agent, or Firm* — Conley Rose, P.C.

(57) ABSTRACT

An optical interconnection system and method are provided. The system includes two or more basic components that are stacked and interconnected. The basic component includes an optical network layer and an electrical layer, where in each basic component, the optical network layer is electrically interconnected with the electrical layer, and the optical network layer of each basic component is optically interconnected with an optical network layer of an adjacent basic component, and through optical interconnection in three-dimensional space, a limitation on a quantity of stacked electrical layers is reduced, and efficiency of signal transmission is increased.

20 Claims, 6 Drawing Sheets

(51) Int. Cl.
*H01L 25/065* (2006.01)
*G02B 6/42* (2006.01)
*G02B 6/12* (2006.01)
*G02B 6/35* (2006.01)
*G02B 6/43* (2006.01)

(52) U.S. Cl.
CPC ............ *G02B 6/3588* (2013.01); *G02B 6/428* (2013.01); *G02B 6/4274* (2013.01); *H01L 25/065* (2013.01); *G02B 6/43* (2013.01); *H01L 2924/0002* (2013.01); *H04Q 2011/005* (2013.01); *H04Q 2011/0052* (2013.01)

(58) Field of Classification Search
CPC .............. G02B 6/12004; G02B 6/3588; G02B 6/4274; G02B 6/428; H01L 25/065; H01L 2924/0002
See application file for complete search history.

(56) References Cited

U.S. PATENT DOCUMENTS

| | | | |
|---|---|---|---|
| 7,532,785 B1 | 5/2009 | Beausoleil et al. | |
| 7,991,250 B2* | 8/2011 | Kim | G02B 6/12002 385/14 |
| 8,559,816 B2* | 10/2013 | Zheng | H04B 10/2504 398/17 |
| 2003/0147266 A1* | 8/2003 | Vyvoda | G11C 16/20 365/63 |
| 2003/0223202 A1* | 12/2003 | Uchida | G02B 6/43 361/760 |
| 2004/0208453 A1* | 10/2004 | Jacobowitz | G02B 6/2826 385/50 |
| 2006/0072871 A1* | 4/2006 | Uchida | G02B 6/43 385/14 |
| 2006/0104562 A1* | 5/2006 | Rosch | G02B 6/42 385/14 |
| 2008/0107378 A9* | 5/2008 | Schilling | G02B 6/34 385/37 |
| 2009/0103855 A1 | 4/2009 | Binkert et al. | |
| 2010/0226657 A1 | 9/2010 | Raymond et al. | |
| 2010/0327424 A1 | 12/2010 | Braunisch et al. | |
| 2011/0298011 A1 | 12/2011 | Lee et al. | |
| 2012/0051695 A1 | 3/2012 | Harada et al. | |
| 2012/0148187 A1 | 6/2012 | Barowski et al. | |

FOREIGN PATENT DOCUMENTS

| | | |
|---|---|---|
| EP | 2469595 A1 | 6/2012 |
| WO | 2013115780 A1 | 8/2013 |

OTHER PUBLICATIONS

Foreign Communication From A Counterpart Application, PCT Application No. PCT/CN2014/093936, English Translation of International Search Report dated Mar. 16, 2015, 2 pages.
Foreign Communication From A Counterpart Application, PCT Application No. PCT/CN2014/093936, English Translation of Written Opinion dated Mar. 16, 2015, 5 pages.

* cited by examiner

OPTICAL INTERCONNECTION SYSTEM AND METHOD

CROSS-REFERENCE TO RELATED APPLICATIONS

This application is a continuation of International Application No. PCT/CN2014/093936, filed on Dec. 16, 2014, which claims priority to Chinese Patent Application No. 201310717025.9, filed on Dec. 23, 2013, both of which are hereby incorporated by reference in their entireties.

TECHNICAL FIELD

The present disclosure relates to the field of packaging technologies, and in particular, to an optical interconnection system and method.

BACKGROUND

Electrical interconnection is an electrical signal transmission mode that mainly uses a copper wire, for example, inter-server cable interconnection (off-board interconnection), copper wire interconnection (on-board interconnection or inter-chip interconnection) on a printed circuit board (PCB), and multi-core interconnection (on-chip interconnection, which uses copper or other metals as a medium). With the development of semiconductor technologies, a line width becomes smaller in mainstream integrated circuit technologies, and the size and speed of a device gradually reach a physical limit, posing a great challenge to integration. In addition, as a processor speed increases, inherent limitations of electrical interconnection gradually become apparent, and parasitic effects such as parasitic capacitance, delay time, and signal crosstalk of conventional metal interconnection cables become very notable. The electrical interconnection mode cannot implement signal transmission efficiently. Therefore, it is necessary to introduce a new interconnection mode.

Compared with the electrical interconnection mode, optical interconnection is an optical signal transmission mode that uses free space (which may be considered as air or vacuum), an optical fiber, a waveguide, or the like as a medium, and has such advantages as higher bandwidth and greater bandwidth density, lower power consumption, shorter delay, and less crosstalk and electromagnetic interference. Replacing electrical interconnection with optical interconnection in computers has become an inevitable trend.

Currently, there is a through silicon via (TSV)-based optical interconnection system architecture. The TSV technology is the latest technology that implements inter-chip interconnection by means of vertical conduction between chips and between wafers. The optical interconnection system architecture is jointly formed by stacking a bare die of a processor layer, a bare die of a memory layer, and a bare die of an optical interconnection network layer. Three-dimensional (3D) electrical interconnection is implemented between the bare dies at the three layers using a bonding technique and the TSV technology. When an electrical signal of the processor layer or the memory layer reaches the optical interconnection network layer through a TSV, the electrical signal is converted into an optical signal. Transmission of the optical signal is implemented on an optical routing topology network of the optical interconnection network layer, and the optical signal is converted into the electrical signal, which is then sent to the processor layer or the memory layer through the TSV.

In the foregoing optical interconnection system architecture, 3D stacked packaging is implemented completely using the TSV technology, and the optical interconnection in the system architecture is implemented using one optical network layer only, causing a long electrical delay and a great loss. As a quantity of stacked layers increases, the delay and loss of a transmission cable increase, which reduces efficiency of signal transmission.

SUMMARY

The present disclosure provides an optical interconnection system and method to increase efficiency of signal transmission and implement optical interconnection in 3D space.

In this specification, a term "basic unit" refers to a component unit of an optical interconnection system, and the basic unit includes an optical network layer and an electrical layer.

In this specification, a term "stacking" refers to mechanical and electronic assembling that is performed on a chip, a packaging part, or a card on a limited surface area of a chip or a circuit board for the purpose of increasing a depth, a width, and/or functions of electronic design.

In this specification, a term "optical network layer" refers to a component of the optical interconnection system, where the component has an integrated optical device and can implement sending, receiving, processing, and transmission of an optical signal.

In this specification, a term "electrical layer" refers to a component of the optical interconnection system, where the component has an integrated electrical device and can implement sending, receiving, processing, and transmission of an electrical signal.

According to a first aspect, an optical interconnection system is provided and includes two or more than two basic units that are stacked and interconnected, where the basic unit includes an optical network layer and an electrical layer. In each basic unit, the optical network layer is electrically interconnected with the electrical layer, and the optical network layer of each basic unit is optically interconnected with an optical network layer of an adjacent basic unit.

With reference to the first aspect, in a first implementation manner, the optical network layer of each basic unit includes an optical transceiver unit and an optical switching unit, where the optical transceiver unit includes an optical transmitting unit and an optical receiving unit, and the optical switching unit includes an arbitration logic device and an inter-layer optical switching unit, where the optical transmitting unit is configured to receive an electrical signal of the electrical layer of the basic unit, convert the electrical signal into an optical signal, and transmit the optical signal to the arbitration logic device. The arbitration logic device is configured to receive the optical signal transmitted by the optical transmitting unit of the basic unit or an optical signal forwarded by an inter-layer optical switching unit of an adjacent basic unit of the basic unit, determine, according to a band of the received optical signal and a preconfigured correspondence between basic units and optical signal bands, whether a destination of the received optical signal is the basic unit, and if yes, transmit the optical signal to the optical receiving unit of the basic unit, otherwise, transmit the optical signal to the inter-layer optical switching unit of the basic unit. The inter-layer optical switching unit is configured to receive the optical signal sent by the arbitration logic device of the basic unit, and transmit the optical signal to an optical network layer of an adjacent basic unit, and the optical receiving unit is configured to receive the optical signal sent by the arbitration logic device of the basic unit, convert the optical signal into an electrical signal, and transmit the electrical signal to the electrical layer of the basic unit.

With reference to the first implementation manner, in a second implementation manner, the electrical layer includes N subunits, a quantity of the optical receiving units is also N, and the optical receiving units are in a one-to-one correspondence with the N subunits of the electrical layer, where the N is an integer greater than or equal to 2, and the optical switching unit further includes an intra-layer optical switching unit configured to receive the optical signal that is output by the arbitration logic device of the basic unit when the arbitration logic device determines that the destination of the optical signal is the basic unit, parse the optical signal to know a subunit in which the destination of the optical signal is located, and transmit the optical signal to an optical receiving unit corresponding to the subunit in which the destination is located. The optical receiving unit corresponding to the subunit in which the destination is located is configured to receive the optical signal output by the intra-layer optical switching unit of the basic unit, convert the optical signal into an electrical signal, and transmit the electrical signal to a subunit of a corresponding electrical layer.

With reference to the first implementation manner, in a third implementation manner, the inter-layer optical switching unit is an optical reflector.

With reference to the first implementation manner, in a fourth implementation manner, the arbitration logic device includes one of an optical micro-ring resonator, an array waveguide grating, or a grating coupler.

With reference to the first aspect, in a fifth implementation manner, the optical network layer of each basic unit is optically interconnected with an optical network layer of an adjacent basic unit through free space, or the optical network layer of each basic unit is optically interconnected with an optical network layer of an adjacent basic unit using a through silicon optical wave guide (TSOWG).

According to a second aspect, an optical interconnection method is provided and applied to the optical interconnection system according to the first aspect, where the two or more than two basic units include a first basic unit and a second basic unit, where the first basic unit includes a first optical network layer and a first electrical layer, the second basic unit includes a second optical network layer and a second electrical layer, and the method includes sending, by the first electrical layer, an electrical signal to the first optical network layer, where a destination of the electrical signal is the second electrical layer, receiving, by the first optical network layer, the electrical signal, converting the electrical signal into an optical signal, and sending the optical signal to the second optical network layer, and receiving, by the second optical network layer, the optical signal, converting the optical signal into the electrical signal, and sending the electrical signal to the second electrical layer.

With reference to the second aspect, in a first implementation manner, the optical interconnection system further includes a third basic unit, where the third basic unit is located between the first basic unit and the second basic unit, and the third basic unit includes a third optical network layer and a third electrical layer, and sending the optical signal to the second optical network layer includes finding, by the first optical network layer according to a band of the optical signal, in a preconfigured correspondence between basic units and optical signal bands, a basic unit corresponding to the band of the optical signal, determining that a destination of the optical signal is the second basic unit, and sending the optical signal to the third optical network layer of the third basic unit such that the third optical network layer forwards the optical signal to the second optical network layer, where the correspondence includes the basic units and optical signal bands corresponding to the basic units, and each basic unit corresponds to a different optical signal band.

With reference to the second aspect, in a second implementation manner, the second electrical layer includes N subunits, where the N is an integer greater than or equal to 2, and receiving, by the second optical network layer, the optical signal, converting the optical signal into the electrical signal, and sending the electrical signal to the second electrical layer includes receiving, by the second optical network layer, the optical signal, and parsing the optical signal to know a subunit that is in the second electrical layer and in which a destination of the optical signal is located, and converting, by the second optical network layer, the optical signal into the electrical signal, and transmitting the electrical signal to the determined subunit in the second electrical layer.

The technical solutions provided by the present disclosure bring about the following advantageous effects: two or more than two basic units are stacked and interconnected, in each basic unit, an optical network layer is electrically interconnected with an electrical layer, and the optical network layer of each basic unit is optically interconnected with an optical network layer of an adjacent basic unit, optical interconnection between stacked layers is introduced such that real optical interconnection is implemented in 3D space. Because optical transmission is characterized by a short delay and a low loss, a limitation on a quantity of stacked electrical layers is reduced, and efficiency of signal transmission is increased.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the present disclosure clearer, the following further describes the embodiments of the present disclosure in detail with reference to the accompanying drawings.

The embodiments of the present disclosure relate to stacked 3D packaging. The stacked 3D packaging refers to 3D packaging based on two-dimensional packaging, where two or more than two chips are stacked vertically in a same package body and the chips are interconnected in stacked layers. The optical interconnection in this packaging may be called optical interconnection in 3D space. An optical interconnection system provided by the embodiments of the present disclosure mainly includes optical network layers and electrical layers, where the optical network layers and the electrical layers are stacked alternately to implement interconnection. An optical network layer and an electrical layer may have a same size or different sizes, which is not further limited in the embodiments of the present disclosure. The optical network layer includes several optical components, which include but are not limited to an optical source, an optical modulator, an optical waveguide, and a photodetector. The electrical layer includes but is not limited to devices such as a processor and/or a memory, and other electrical devices that transmit or process electrical signals. A quantity of processors and a quantity of memories in the electrical layer are not further limited in the embodiments of the present disclosure.

Embodiment 1

Figure 1A:
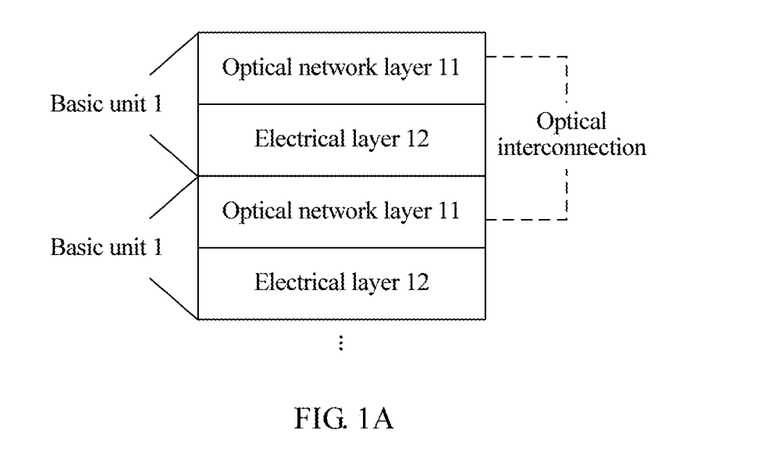
FIG. 1A is a schematic structural diagram of an optical interconnection system according to Embodiment 1 of the present disclosure.

Referring to FIG. 1A, Embodiment 1 provides an optical interconnection system, including two or more than two basic units 1 that are stacked and interconnected. The basic unit 1 includes an optical network layer 11 and an electrical layer 12. In each basic unit 1, the optical network layer 11 is electrically interconnected with the electrical layer 12, and the optical network layer 11 of each basic unit 1 is optically interconnected with an optical network layer 11 of an adjacent basic unit 1.

Figure 1B:
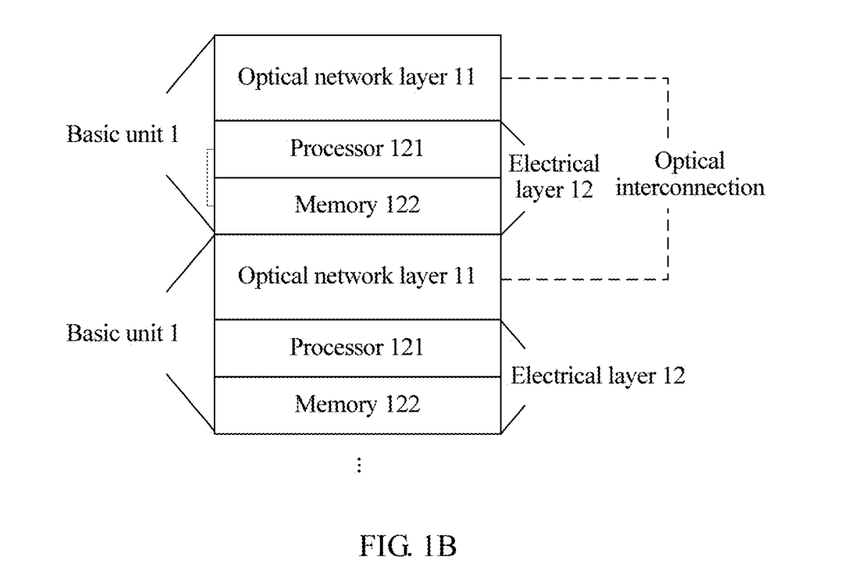
FIG. 1B is another schematic structural diagram of the optical interconnection system according to Embodiment 1 of the present disclosure.

The electrical layer 12 may include devices such as a processor and/or a memory, and certainly may also include other electrical devices that transmit or process electrical signals, which is not limited in this embodiment. A quantity of processors and a quantity of memories are not limited in this embodiment. In addition, all devices in the electrical layer may be located at the same layer or at different layers, which is not limited in this embodiment. Referring to FIG. 1B, FIG. 1B is a schematic diagram of the optical interconnection system where the electrical layer 12 includes a processor and a memory. It can be seen from the figure that the optical interconnection system includes two or more than two basic units 1 that are stacked and interconnected. The basic unit 1 includes an optical network layer 11 and an electrical layer 12. The electrical layer includes a processor 121 and a memory 122, and the processor 121 and the memory 122 are located at different layers. In each basic unit 1, the optical network layer 11 is electrically interconnected with the processor 121 and the memory 122, while the optical network layer 11 of each basic unit 1 is optically interconnected with an optical network layer 11 of the adjacent basic unit 1.

That the optical network layer 11 is electrically interconnected with the processor 121 and the memory 122 means that electrical interconnection is implemented using the TSV technology.

In this embodiment, in a first scenario, the optical network layer 11 of each basic unit 1 is optically interconnected with the optical network layer 11 of the adjacent basic unit 1 through free space.

In the basic unit 1, an area of the optical network layer 11 may be larger than an area of the electrical layer 12. In this case, it can be ensured that optical signals between adjacent optical network layers are not blocked and that optical interconnection can be implemented in free space.

In this embodiment, in a second scenario, the optical network layer 11 of each basic unit 1 is optically interconnected with the optical network layer 11 of the adjacent basic unit 1 using a TSOWG.

In this embodiment, the basic units 1 may be classified into edge basic units and intermediate basic units. An edge basic unit has an adjacent basic unit on only one side in a stacking direction and has no adjacent basic unit on the other side. The edge basic unit is located at a top or bottom layer of the foregoing system. An intermediate basic unit has an adjacent basic unit on both sides in the stacking direction, and the intermediate basic unit is located between a basic unit at the top layer and a basic unit at the bottom layer. An inter-layer optical switching unit of the optical network layer of the edge basic unit implements transmission of an optical signal with an optical network layer of an adjacent basic unit. An inter-layer optical switching unit of the optical network layer of the intermediate basic unit implements transmission of an optical signal with the optical network layers of two adjacent basic units.

Figure 1C:
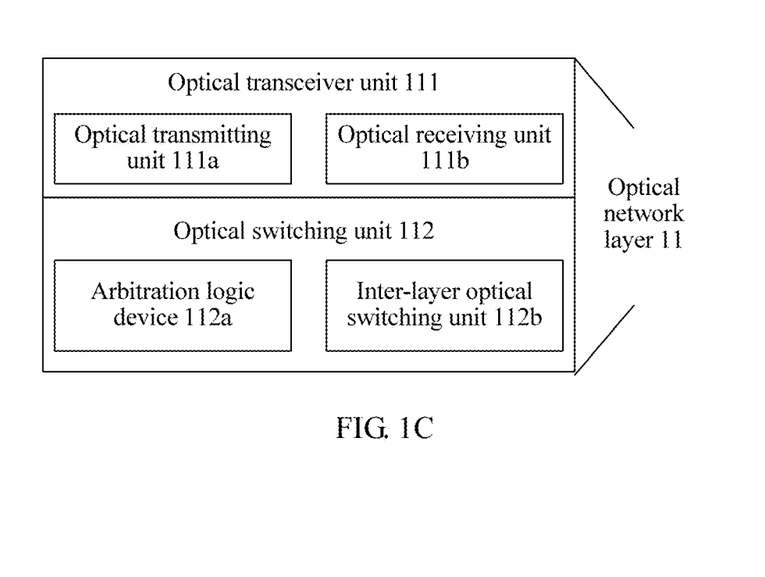
FIG. 1C is a schematic structural diagram of an optical network layer according to Embodiment 1 of the present disclosure.

Referring to FIG. 1C, in this embodiment, the optical network layer 11 of each basic unit 1 may include an optical transceiver unit 111 and an optical switching unit 112. The optical transceiver unit 111 may include an optical transmitting unit 111a and an optical receiving unit 111b, and the optical switching unit 112 may include an arbitration logic device 112a and an inter-layer optical switching unit 112b.

The optical transmitting unit 111a is configured to receive an electrical signal of the electrical layer 12 of the basic unit 1, convert the electrical signal into an optical signal, and transmit the optical signal to the arbitration logic device 112a.

Optionally, in a specific implementation process, the optical transmitting unit 111a includes an electro-optical converter and an optical transmitter.

The arbitration logic device 112a is configured to receive the optical signal transmitted by the optical transmitting unit 111a of the basic unit 1 or an optical signal forwarded by an inter-layer optical switching unit 112b of an adjacent basic unit of the basic unit 1, determine, according to a band of the received optical signal and a preconfigured correspondence between basic units 1 and optical signal bands, whether a destination of the received optical signal is the basic unit 1, and if yes, transmit the optical signal to the optical receiving unit 111*b* of the basic unit 1, otherwise, transmit the optical signal to the inter-layer optical switching unit 112*b* of the basic unit 1.

The inter-layer optical switching unit 112*b* is configured to receive the optical signal sent by the arbitration logic device 112*a* of the basic unit 1, and transmit the optical signal to the optical network layer 11 of the adjacent basic unit 1.

The optical receiving unit 111*b* is configured to receive the optical signal sent by the arbitration logic device 112*a* of the basic unit 1, convert the optical signal into the electrical signal, and transmit the electrical signal to the electrical layer 12 of the basic unit 1.

Figure 1D:
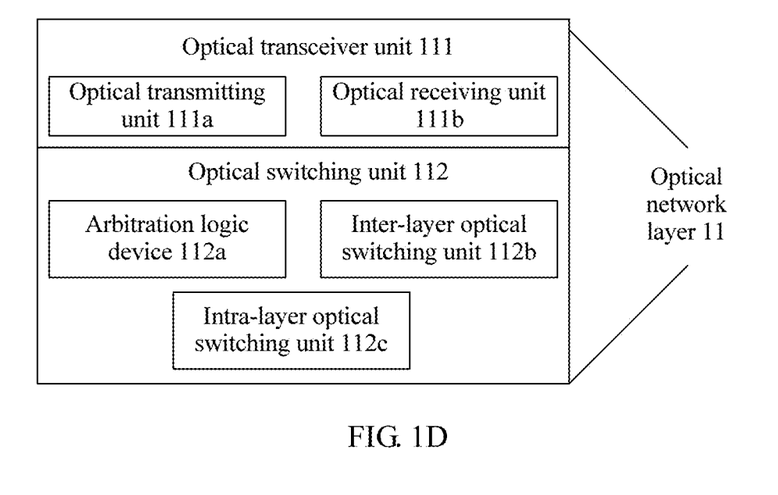
FIG. 1D is another schematic structural diagram of the optical network layer according to Embodiment 1 of the present disclosure.

Referring to FIG. 1D, in this embodiment, the electrical layer may include N subunits, a quantity of the optical receiving units is also N, and the optical receiving units are in a one-to-one correspondence with the N subunits of the electrical layer, where the N is an integer greater than or equal to 2. Preferably, the optical switching unit 112 may further include an intra-layer optical switching unit 112*c* configured to receive the optical signal that is output by the arbitration logic device 112*a* of the basic unit 1 when the arbitration logic device 112*a* determines that the destination of the optical signal is the basic unit 1, parse the optical signal to know a subunit in which the destination of the optical signal is located, and transmit the optical signal to an optical receiving unit 111*b* corresponding to the subunit in which the destination is located, where the optical receiving unit 111*b* corresponding to the subunit in which the destination is located is configured to receive the optical signal output by the intra-layer optical switching unit 112*c* of the basic unit 1, convert the optical signal into an electrical signal, and transmit the electrical signal to a subunit of a corresponding electrical layer.

In a specific implementation process, the intra-layer optical switching unit 112*c* may include an optical signal receiving module configured to receive the optical signal that is output by the arbitration logic device 112*a* of the basic unit 1 when the arbitration logic device 112*a* determines that the destination of the optical signal is the basic unit 1, a parsing module configured to parse the optical signal to know the subunit in which the destination of the optical signal is located, and a transmitting module configured to transmit the optical signal to the optical receiving unit 111*b* corresponding to the subunit in which the destination is located.

The parsing module may know, using either of the following manners, the subunit in which the destination of the optical signal is located.

In the first manner, the parsing module parses the optical signal to obtain a wavelength of the optical signal, finds, in a preconfigured correspondence between wavelengths and subunits, a subunit corresponding to the wavelength of the optical signal, and uses the found subunit as the subunit in which the destination of the optical signal is located.

In the second manner, the parsing module may include a photodetector configured to convert the optical signal into the electrical signal and parse the electrical signal to know the subunit in which the destination of the optical signal is located, and correspondingly, the transmitting module may include an optical switch control unit configured to control, according to the subunit that is known by the photodetector and in which the destination of the optical signal is located, the transmission of the optical signal to the optical receiving unit 111*b* corresponding to the subunit in which the destination is located.

In this embodiment, the inter-layer optical switching unit may be an optical reflector. The arbitration logic device 112*a* includes but is not limited to one of the following an optical micro-ring resonator, an array waveguide grating, or a grating coupler, or another wavelength-sensitive optical device.

In the foregoing system provided by this embodiment, two or more than two basic units are stacked and interconnected. In each basic unit, an optical network layer is electrically interconnected with an electrical layer, and the optical network layer of each basic unit is optically interconnected with an optical network layer of an adjacent basic unit, optical interconnection between stacked layers is introduced such that real optical interconnection is implemented in 3D space. Because optical network layers and electrical layers are stacked alternately and optical transmission is characterized by a short delay and a low loss, which helps increase a quantity of stacked layers, not only a limitation on a quantity of stacked electrical layers is reduced, but also efficiency of signal transmission is increased.

It should be noted that the optical interconnection system shown in FIG. 1B includes stacked basic units having a same structure. In a specific implementation process, there is also an optical interconnection system including stacked basic units having different internal structures. For example, a basic unit 1 includes an optical network layer, a processor layer, and a memory layer, a basic unit 2 includes an optical network layer and a processor layer, where the basic unit 1 and the basic unit 2 are mutually stacked to constitute an optical interconnection system.

Figure 2:
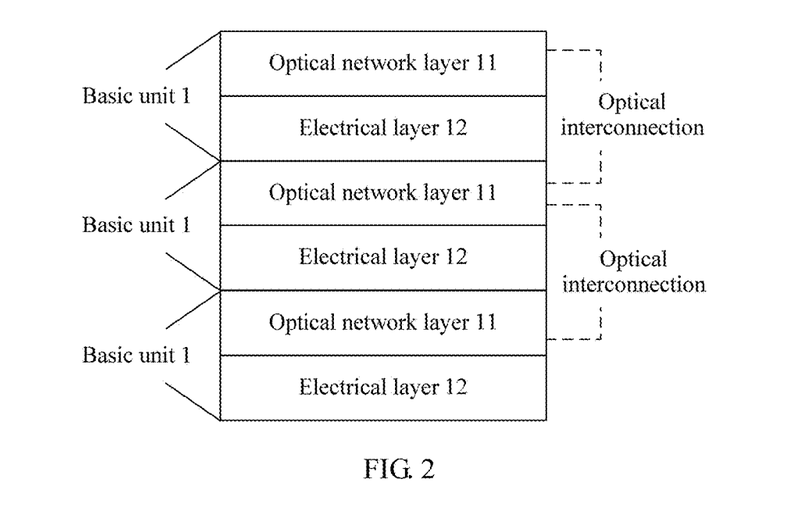
FIG. 2 is a schematic structural diagram of a three-layer optical interconnection system according to Embodiment 1 of the present disclosure.

In addition, in an actual application, there are generally multiple stacked layers in an optical interconnection system, and the quantity of stacked layers is equal to a quantity of basic units in the optical interconnection system. For example, referring to FIG. 2, FIG. 2 shows a three-layer optical interconnection system provided by this embodiment. The system includes three basic units, where each basic unit 1 includes an optical network layer 11 and an electrical layer 12, and two adjacent optical network layers 11 are optically interconnected.

Embodiment 2

This embodiment provides an optical interconnection system, including two or more than two basic units that are stacked and interconnected. The basic unit includes an optical network layer and an electrical layer. In each basic unit, electrical interconnection is implemented between the optical network layer and the electrical layer using the TSV, and optical interconnection is implemented between the optical network layer of each basic unit and an optical network layer of an adjacent basic unit through free space. In each basic unit, an area of the optical network layer may be larger than an area of the electrical layer. Preferably, the area of the optical network layer may be slightly larger than the area of the electrical layer.

In this embodiment, an electrical layer may include devices such as a processor and/or a memory, and certainly may also include other electrical devices that transmit or process electrical signals, which is not limited in this embodiment. A quantity of processors and a quantity of memories are not limited in this embodiment. In addition, all devices in the electrical layer may be located at the same layer or at different layers, which is not limited in this embodiment.

Figure 3:
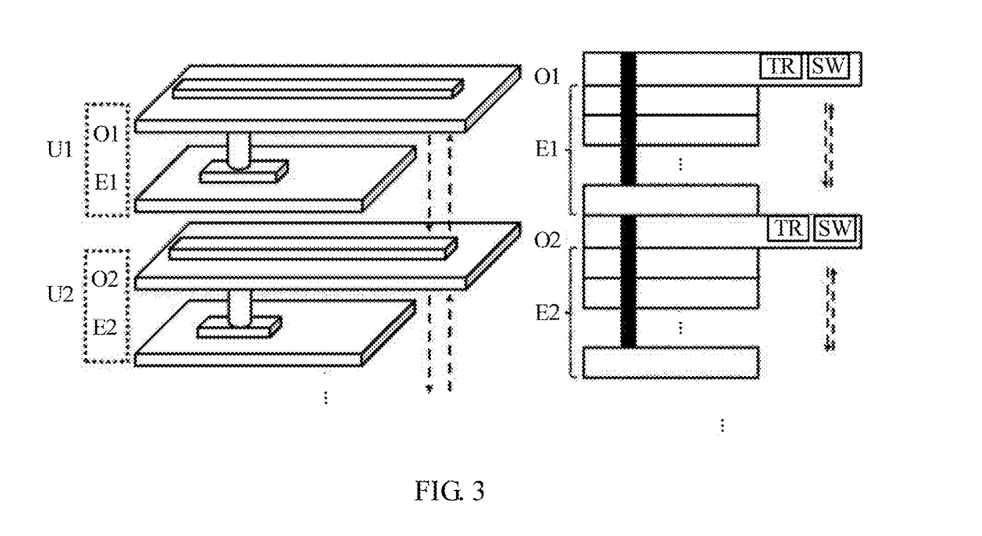
FIG. 3 is a schematic structural diagram of an optical interconnection system according to Embodiment 2 of the present disclosure.

Referring to FIG. 3, FIG. 3 is a schematic structural diagram of the foregoing system. In FIG. 3, a basic unit U1 includes an optical network layers O1 and an electrical layer E1, and a basic unit U2 includes an optical network layers O2 and an electrical layer E2. Both the electrical layers E1 and E2 include multiple sublayers, and all sublayers in the electrical layers E1 and E2 are electrically interconnected. Any layer of the multiple sublayers may be a processor or a memory or the like. The optical network layers O1 is electrically interconnected with each sublayer in the electrical layer E1, while the optical network layers O2 is electrically interconnected with each sublayer in the electrical layer E2. Electrical interconnection herein refers to electrical interconnection that is implemented using the TSV technology. It can be seen from the figure that an area of the optical network layers O1 is larger than an area of the electrical layer E1 and that an area of the optical network layers O2 is larger than an area of the electrical layer E2. In this way, it can be ensured that optical signals between two adjacent optical network layers are not blocked and can be transmitted through free space. Therefore, optical interconnection is implemented between the two adjacent optical network layers, and real 3D optical interconnection is implemented. In the figure, a dashed line having an arrow between the optical network layers O1 and O2 indicates that the optical network layers are optically interconnected through free space.

Each layer in FIG. 3 is illustrated in a rectangle shape, but the shape of each layer is not limited in the present disclosure. Certainly, in other implementation manners, each layer may also be in a square shape or another shape.

In the foregoing system provided by this embodiment, the basic units may be classified into edge basic units and intermediate basic units. An edge basic unit has an adjacent basic unit on only one side in a stacking direction and has no adjacent basic unit on the other side. The edge basic unit is located at a top or bottom layer of the foregoing system. An intermediate basic unit has an adjacent basic unit on both sides in the stacking direction, and the intermediate basic unit is located between a basic unit at the top layer and a basic unit at the bottom layer. A quantity of intermediate basic units may be zero, or one, or more than one. Generally, there are multiple intermediate basic units. In the foregoing system, a total quantity of basic units is a quantity of stacked layers in the system. The quantity of stacked layers may be set according to a requirement, for example, it may be set to 16, 20, 30, 35, or 40, which is not limited in this embodiment.

In this embodiment, the optical network layer may include an optical transceiver unit and an optical switching unit, where the optical transceiver unit may include an optical transmitting unit and an optical receiving unit, and the optical switching unit may include an arbitration logic device and an inter-layer optical switching unit. For details, refer to FIG. 1C and the descriptions in Embodiment 1, and details are not described herein again.

It should be noted that the optical transceiver unit and the optical switching unit in each layer are both located in an area where the optical network layer goes beyond the electrical layer, which ensures that optical interconnection can be implemented between adjacent optical network layers through free space.

Using FIG. 3 as an example, the basic unit U1 is located at the top layer, while the basic unit U2 is located between the top layer and the bottom layer. Both the optical network layers O1 and O2 include an optical transceiver unit TR and an optical switching unit SW. Transmission of an optical signal is implemented in free space using the optical switching unit SW between the optical network layers O1 and O2. It can be seen from the figure that the optical transceiver unit TR and the optical switching unit SW are both located in the area where the optical network layer goes beyond the electrical layer, which avoids blocking in a transmission path and ensures that an optical signal can be transmitted in free space.

Figure 4:
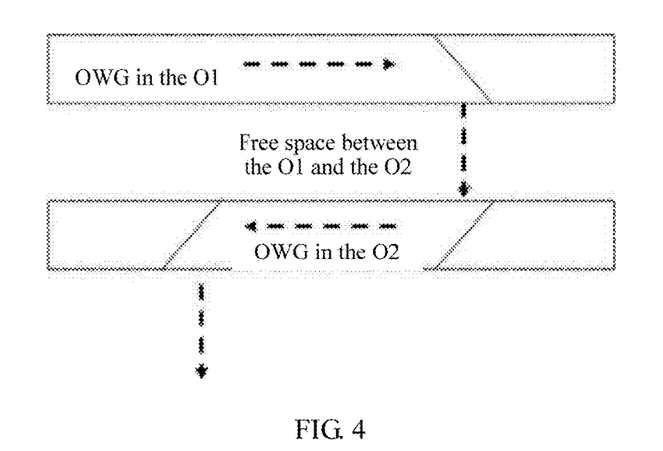
FIG. 4 is a schematic diagram of optical interconnection in free space according to Embodiment 2 of the present disclosure.

The inter-layer optical switching unit involved in this embodiment includes but is not limited to an optical reflector, where the optical reflector may be developed using a semiconductor micro-nanofabrication technology. Referring to FIG. 4, FIG. 4 is a schematic diagram in which an optical reflector is used as an inter-layer optical switching unit. In FIG. 4, an optical signal in an optical network layers O1 is reflected by the optical reflector and then is transmitted down to an optical network layers O2 through free space. In the O2, the optical signal is reflected by an optical reflector on the right side to an optical reflector on the left side, and the optical signal is further reflected by the optical reflector on the left side to a lower optical network layer, and so on, until the optical signal is transmitted to an optical network layer at the bottom.

In addition, in this embodiment, the electrical layer may include N subunits, a quantity of the optical receiving units is also N, and the optical receiving units are in a one-to-one correspondence with the N subunits of the electrical layer, where the N is an integer greater than or equal to 2. The optical switching unit may further include an intra-layer optical switching unit. Further, the intra-layer optical switching unit may include an optical signal receiving module, a parsing module, and a transmitting module. Refer to FIG. 1D and the descriptions in Embodiment 1 for details, which are not repeated herein. The arbitration logic device includes but is not limited to one of an optical micro-ring resonator, an array waveguide grating, or a grating coupler, or another wavelength-sensitive optical device. Band selection may be implemented by setting or adjusting parameters of the optical device. This technology pertains to the prior art, and details are not described again herein.

In this embodiment, a preconfigured correspondence between basic units and optical signal bands may include basic units and optical signal bands corresponding to the basic units, and each basic unit corresponds to a different optical signal band, which ensures that bands that the basic units can receive do not overlap. A transmission direction of a current optical signal may be determined using the arbitration logic device.

Figure 5:
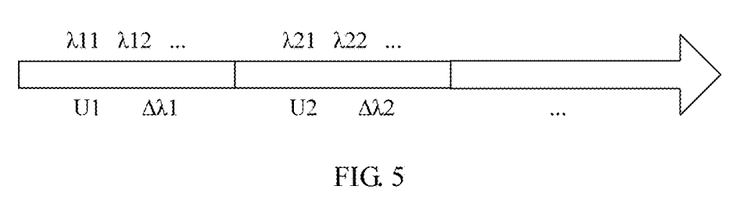
FIG. 5 is a schematic diagram of a correspondence between basic units and optical signal bands according to Embodiment 2 of the present disclosure.

Referring to FIG. 5, FIG. 5 is a schematic diagram of a correspondence between basic units and optical signal bands. In FIG. 5, an optical signal band corresponding to a basic unit U1 is $\Delta\lambda 1$, which includes wavelengths $\lambda 11$, $\lambda 2$, . . . , and so on, an optical signal band corresponding to a basic unit U2 is $\Delta\lambda 2$, which includes wavelengths 221, 222, . . . , and so on. The rest may be deduced by analog. This ensures that the optical signal bands corresponding to the basic units do not overlap and makes it convenient to configure bands, featuring flexibility in application.

In the foregoing system provided by this embodiment, two or more than two basic units are stacked and interconnected. In each basic unit, an optical network layer is electrically interconnected with an electrical layer, and the optical network layer of each basic unit is optically interconnected with an optical network layer of an adjacent basic unit. Optical interconnection between stacked layers is introduced such that real optical interconnection is implemented in 3D space. Because optical network layers and electrical layers are stacked alternately and optical transmission is characterized by a short delay and a low loss, which helps increase a quantity of stacked layers, not only a limitation on a quantity of stacked electrical layers is reduced, but also efficiency of signal transmission is increased.

Embodiment 3

This embodiment provides an optical interconnection system, including two or more than two basic units that are stacked and interconnected. The basic unit includes an optical network layer and an electrical layer. In each basic unit, electrical interconnection is implemented between the optical network layer and the electrical layer using the TSV, and optical interconnection is implemented between the optical network layer of each basic unit and an optical network layer of an adjacent basic unit using a TSOWG.

This embodiment differs from Embodiment 2 only in a form of optical interconnection, where content about the electrical layer is the same as that in Embodiment 2. Refer to the descriptions in Embodiment 2 for details, which are not repeated herein.

Figure 6:
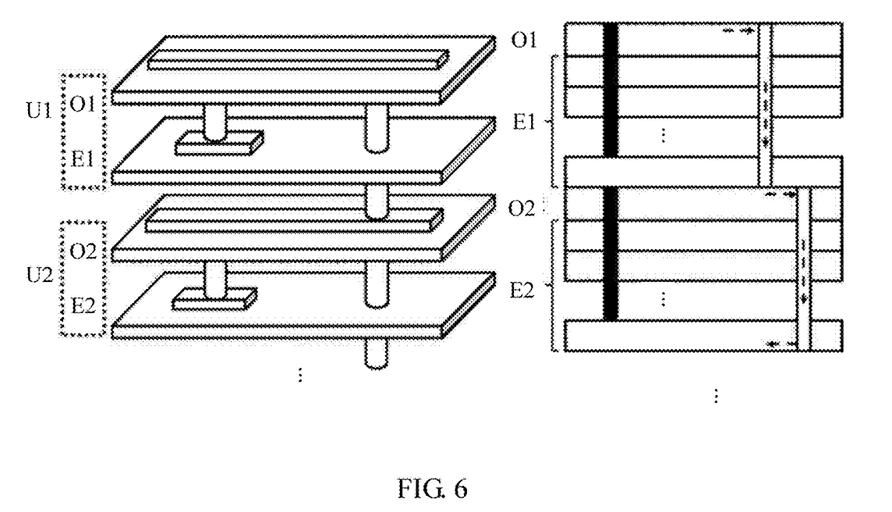
FIG. 6 is a schematic structural diagram of an optical interconnection system according to Embodiment 3 of the present disclosure.

Referring to FIG. 6, FIG. 6 is a schematic structural diagram of the foregoing system. In FIG. 6, a basic unit U1 includes an optical network layers O1 and an electrical layer E1, and a basic unit U2 includes an optical network layers O2 and an electrical layer E2. Both the electrical layers E1 and E2 include multiple sublayers, and all sublayers in the electrical layers E1 and E2 are electrically interconnected. Any layer of the multiple sublayers may be a processor or a memory or the like. The optical network layers O1 is electrically interconnected with each sublayer in the electrical layer E1, while the optical network layers O2 is electrically interconnected with each sublayer in the electrical layer E2. Electrical interconnection herein refers to electrical interconnection that is implemented using a TSV technology. The optical network layers O1 is optically interconnected with the optical network layers O2 using a TSOWG. The TSOWG passes through the electrical layer only and is interconnected with the optical network layer only. Optical interconnection is implemented between optical network layers using the TSOWG such that real 3D interconnection is implemented.

In the foregoing system provided by this embodiment, the basic units may be classified into edge basic units and intermediate basic units. A quantity of intermediate basic units may be zero, or one, or more than one. In the foregoing system, a total quantity of basic units is a quantity of stacked layers in the system, and the quantity of layers may be set according to needs. Refer to the descriptions in the foregoing embodiments for details, which are not repeated herein.

In this embodiment, the optical network layer may include an optical transceiver unit and an optical switching unit, where the optical transceiver unit may include an optical transmitting unit and an optical receiving unit, and the optical switching unit may include an arbitration logic device and an inter-layer optical switching unit. Refer to FIG. 1C and the descriptions in Embodiment 1 for details, which are not repeated herein.

The optical transceiver unit and the optical switching unit in each of the foregoing layers implement transmission of an optical signal using the TSOWG, thereby ensuring optical interconnection between adjacent optical network layers.

Figure 7:
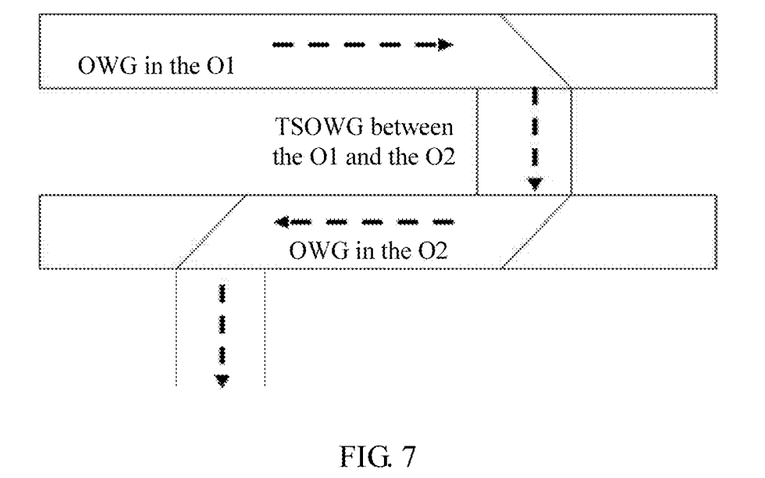
FIG. 7 is a schematic diagram of optical interconnection using a TSOWG according to Embodiment 3 of the present disclosure.

The inter-layer optical switching unit involved in this embodiment includes but is not limited to an optical reflector, where the optical reflector may be developed using a semiconductor micro-nanofabrication technology. Referring to FIG. 7, FIG. 7 is a schematic diagram in which an optical reflector is used as an inter-layer optical switching unit. In FIG. 7, an optical signal in an optical network layers O1 is reflected by an optical reflector and then is transmitted down to an optical network layers O2 through a TSOWG. In the O2, the optical signal is reflected by an optical reflector on the right side to an optical reflector on the left side, and the optical signal is further reflected by the optical reflector on the left side to a lower optical network layer through the TSOWG, and so on, until the optical signal is transmitted to an optical network layer at the bottom.

In addition, in this embodiment, the electrical layer may include N subunits, a quantity of the optical receiving units is also N, and the optical receiving units are in a one-to-one correspondence with the N subunits of the electrical layer, where the N is an integer greater than or equal to 2. The optical switching unit may further include an intra-layer optical switching unit. Further, the intra-layer optical switching unit may include an optical signal receiving module, a parsing module, and a transmitting module. Refer to FIG. 1D and the descriptions in Embodiment 1 for details, which are not repeated herein. The arbitration logic device includes but is not limited to one of the following: an optical micro-ring resonator, an array waveguide grating, or a grating coupler, or another wavelength-sensitive optical device. Band selection may be implemented by setting parameters of the optical device.

In this embodiment, a preconfigured correspondence between electrical layers and optical signal bands may include electrical layers and optical signal bands corresponding to the electrical layers, and the electrical layers correspond to different optical signal bands, which ensures that bands that the basic units can receive do not overlap. Refer to the descriptions in Embodiment 2 for details, which are not repeated herein.

In the foregoing system provided by this embodiment, two or more than two basic units are stacked and interconnected. In each basic unit, an optical network layer is electrically interconnected with an electrical layer, and the optical network layer of each basic unit is optically interconnected with an optical network layer of an adjacent basic unit. Optical interconnection between stacked layers is introduced such that real optical interconnection is implemented in 3D space. Because optical network layers and electrical layers are stacked alternately and optical transmission is characterized by a short delay and a low loss, which helps increase a quantity of stacked layers, not only a limitation on a quantity of stacked electrical layers is reduced, but also efficiency of signal transmission is increased.

Embodiment 4

Figure 8A:
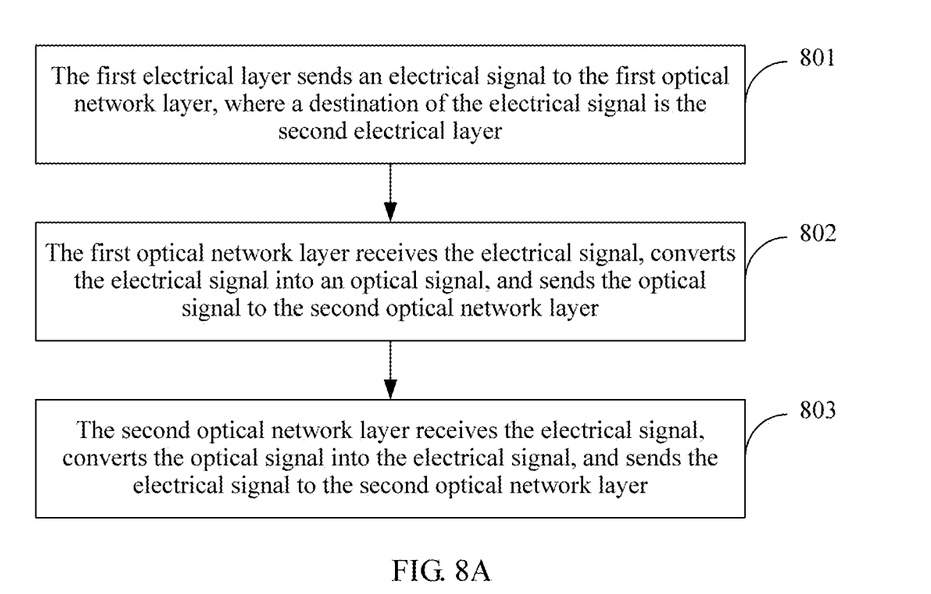
FIG. 8A is a flowchart of an optical interconnection method according to Embodiment 4 of the present disclosure.

Referring to FIG. 8A, this embodiment provides an optical interconnection method applied to the optical interconnection system in any one of the foregoing embodiments. The two or more than two basic units include a first basic unit and a second basic unit, where the first basic unit includes a first optical network layer and a first electrical layer, and the second basic unit includes a second optical network layer and a second electrical layer. The method includes the following steps.

Step 801: The first electrical layer sends an electrical signal to the first optical network layer, where a destination of the electrical signal is the second electrical layer.

Step 802: The first optical network layer receives the electrical signal, converts the electrical signal into an optical signal, and sends the optical signal to the second optical network layer.

Step 803: The second optical network layer receives the electrical signal, converts the optical signal into the electrical signal, and sends the electrical signal to the second optical network layer.

In this embodiment, the optical interconnection system further includes a third basic unit, where the third basic unit is located between the first basic unit and the second basic unit, and the third basic unit includes a third optical network layer and a third electrical layer. For example, referring to FIG. 2, the first basic unit, the third basic unit, and the second basic unit in the figure may be arranged from top to bottom.

Figure 8B:
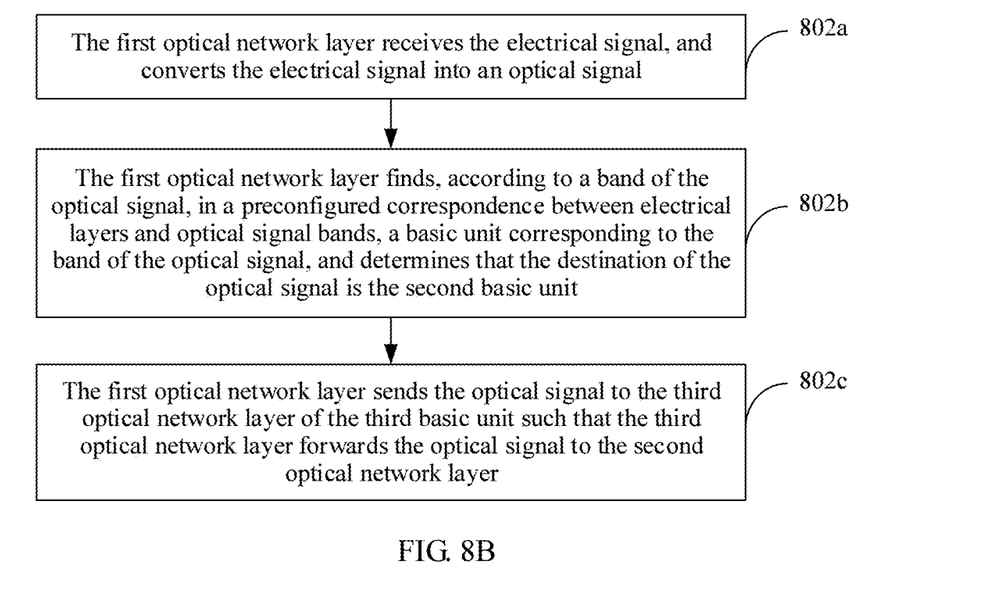
FIG. 8B is a specific flowchart of step 802 according to Embodiment 4 of the present disclosure.

Referring to FIG. 8B, in this embodiment, step 802 may include the following steps.

Step 802a: The first optical network layer receives the electrical signal, and converts the electrical signal into an optical signal.

Step 802b: The first optical network layer finds, according to a band of the optical signal, in a preconfigured correspondence between electrical layers and optical signal bands, a basic unit corresponding to the band of the optical signal, and determines that a destination of the optical signal is the second basic unit.

The correspondence includes the basic units and optical signal bands corresponding to the basic units, and each basic unit corresponds to a different optical signal band.

Step 802c: The first optical network layer sends the optical signal to the third optical network layer of the third basic unit such that the third optical network layer forwards the optical signal to the second optical network layer.

In addition, it should be noted that there may be one or more third basic units.

In this embodiment, the second electrical layer may include N subunits, where the N is an integer greater than or equal to 2. Correspondingly, the foregoing step 803 may include that the second optical network layer receives the optical signal, and parses the optical signal to know a subunit that is in the second electrical layer and in which a destination of the optical signal is located, and the second optical network layer converts the optical signal into the electrical signal, and transmits the electrical signal to the determined subunit in the second electrical layer.

The following describes the foregoing method processes in detail with reference to FIG. 3. If a processor in the E1 processor layer needs to read data in a memory of the E2, the processor sends a data processing instruction, where the data processing instruction reaches the optical network layers O1 in a form of an electrical signal through an intra-layer metal interconnection line and a TSV interconnection line. The optical transmitting unit in the optical transceiver unit TR in the optical network layers O1 converts the electrical signal into an optical signal, and then the inter-layer optical switching unit in the optical switching unit SW transmits the optical signal to the optical network layers O2. If the arbitration logic device of the O2 layer determines that a destination of the optical signal is a basic unit in which the O2 layer is located, the intra-layer optical switching unit in the optical switching unit SW of the O2 transmits the optical signal to the optical receiving unit in the optical transceiver unit TR of the O2. The optical receiving unit converts the optical signal into the electrical signal, that is, the data processing instruction, and transmits the electrical signal to the memory in the electrical layer E2 through the TSV such that an operation of reading data in the memory is performed. The read data may be transmitted through a transmission path of the foregoing data processing instruction to the processor of the E1 in an opposite direction.

In the foregoing method provided by this embodiment, through optical interconnection between optical network layers, an optical signal is transmitted between the optical network layers, and an electrical signal is transmitted at an electrical layer such that signal transmission and data processing are implemented between stacked layers that are optically interconnected. Because optical network layers and electrical layers are stacked alternately and optical transmission is characterized by a short delay and a low loss, a limitation on a quantity of stacked electrical layers is reduced, and efficiency of signal transmission is also increased.

A person of ordinary skill in the art may understand that all or some of the steps of the embodiments may be implemented by hardware or a program instructing related hardware. The program may be stored in a computer-readable storage medium. The storage medium may include a read-only memory, a magnetic disk, an optical disc, or the like.

The foregoing descriptions are merely exemplary embodiments of the present disclosure, but are not intended to limit the present disclosure. Any modification, equivalent replacement, or improvement made without departing from the spirit and principle of the present disclosure should fall within the protection scope of the present disclosure.

What is claimed is:

1. An optical interconnection system, comprising:
two or more basic components that are interconnected,
wherein each basic component comprises an optical network layer and an electrical layer,
wherein the optical network layer of the basic component comprises an optical transceiver and an optical switch,
wherein the optical transceiver comprises an optical receiver,
wherein the optical switch comprises an arbitration logic device and an inter-layer optical switch,
wherein the optical network layer of the basic component is electrically interconnected with the electrical layer,
wherein the optical network layer of the basic component is optically interconnected with an optical network layer of another basic component,
wherein an arbitration logic device of a first basic component is configured to:
  receive a first optical signal;
  transmit the first optical signal to an optical receiver of the first basic component when the destination of the first optical signal is the first basic component; and
  transmit the first optical signal to an inter-layer optical switch of the first basic component when the destination of the first optical signal is not the first basic component,
wherein the inter-layer optical switch of the first basic component is configured to transmit the first optical signal to an optical network layer of an adjacent basic component of the first basic component when the inter-layer optical switch of the first basic component receive the first optical signal transmitted by the arbitration logic device of the first basic component, and
wherein the optical receiver of the first basic component is configured to:

convert the first optical signal into a first electrical signal when the optical receiver of the first basic component receive the first optical signal transmitted by the arbitration logic device of the first basic component; and transmit the first electrical signal to an electrical layer of the first basic component.

2. The system according to claim 1, wherein the arbitration logic device of the first basic component is configured to receive the first optical signal that is forwarded by an inter-layer optical switch of the adjacent basic component of the first basic component.

3. The system according to claim 1, wherein the optical transceiver of the basic component further comprises an optical transmitter, wherein an optical transmitter of the first basic component is configured to:

receive the first electrical signal of the electrical layer of the first basic component;

convert the first electrical signal into the first optical signal; and transmit the first optical signal to the arbitration logic device, and wherein the arbitration logic device of the first basic component is configured to receive the first optical signal that is transmitted by the optical transmitter of the first basic component.

4. The system according to claim 1, wherein the electrical layer comprises N subcomponents, wherein the optical receiver of the basic component comprises N optical receiving subcomponents, wherein the N optical receiving subcomponents are in a one-to-one correspondence with the N subcomponents of the electrical layer, wherein the N is an integer greater than 2, wherein the optical switch of the basic component further comprises an intra-layer optical switch of the basic component, wherein the arbitration logic device of the first basic component is configured to transmit the first optical signal to an intra-layer optical switch of the first basic component when the arbitration logic device determines that the destination of the first optical signal is the first basic component, and wherein the intra-layer optical switch of the first basic component is configured to:

parse the first optical signal to know a subcomponent which is the destination of the first optical signal; and transmit the first optical signal to an optical receiving subcomponent corresponding to the subcomponent which is the destination of the first optical signal.

5. The system according to claim 1, wherein the electrical layer comprises N subcomponents, wherein the optical receiver of the basic component comprises N optical receiving subcomponents, wherein the N optical receiving subcomponents are in a one-to-one correspondence with the N subcomponents of the electrical layer, wherein the N is an integer equal to 2, wherein the optical switch of the basic component further comprises an intra-layer optical switch of the basic component, wherein the arbitration logic device of the first basic component is configured to transmit the first optical signal to an intra-layer optical switch of the first basic component when the arbitration logic device determines that the destination of the first optical signal is the first basic component, and wherein the intra-layer optical switch of the first basic component is configured to:

parse the first optical signal to know a subcomponent which is the destination of the first optical signal; and transmit the first optical signal to an optical receiving subcomponent corresponding to the subcomponent which is the destination of the first optical signal.

6. The system according to claim 1, wherein the inter-layer optical switch of the first basic component is an optical reflector.

7. The system according to claim 1, wherein the arbitration logic device of the first basic component comprises an optical micro-ring resonator.

8. The system according to claim 1, wherein the arbitration logic device of the first basic component comprises an array waveguide grating.

9. The system according to claim 1, wherein the arbitration logic device of the first basic component comprises a grating coupler.

10. The system according to claim 1, wherein an optical network layer of the first basic component is optically interconnected with the optical network layer of the adjacent basic component of the first basic component through free space.

11. The system according to claim 1, wherein the optical network layer of the first basic component is optically interconnected with the optical network layer of the adjacent basic component of the first basic component using a through silicon optical wave guide (TSOWG).

12. An optical interconnection system, wherein the system comprises:

two or more basic components that are interconnected, wherein each basic component comprises an optical network layer and an electrical layer, wherein the optical network layer is electrically interconnected with the electrical layer, wherein the optical network layer of the basic component is optically interconnected with an optical network layer of another basic component, wherein an optical network layer of a first basic component is configured to:

receive a first optical signal;

determine, according to a band of the first optical signal, whether a destination of the first optical signal is the first basic component;

transmit the first optical signal to an optical network layer of an adjacent basic component of the first basic component when the destination of the first optical signal is not the first basic component;

convert the first optical signal into a first electrical signal when the destination of the first optical signal is the first basic component; and transmit the first electrical signal to an electrical layer of the first basic component.

13. The system according to claim 12, wherein the optical network layer of the first basic component is further configured to receive the first optical signal that is forwarded by the optical network layer of the adjacent basic component of the first basic component.

14. The system according to claim 12, wherein the optical network layer of the first basic component is further configured to:

receive the first electrical signal of the electrical layer of the first basic component; and convert the first electrical signal into the first optical signal.

15. The system according to claim 12, wherein the electrical layer comprises N subcomponents, wherein the optical network layer of the first basic component comprises N optical receiving subcomponents, wherein the N optical receiving subcomponents are in a one-to-one correspondence with the N subcomponents of the electrical layer, wherein the N is an integer greater than 2, and wherein the optical network layer of the first basic component is further configured to:
    parse the first optical signal to know a subcomponent which is the destination of the first optical signal when the optical network layer of the first basic component determines that the destination of the first optical signal is the first basic component; and
    transmit the first optical signal to an optical receiving subcomponent corresponding to the subcomponent which is the destination of the first optical signal.

16. The system according to claim 12, wherein the electrical layer comprises N subcomponents, wherein the optical network layer of the first basic component comprises N optical receiving subcomponents, wherein the N optical receiving subcomponents are in a one-to-one correspondence with the N subcomponents of the electrical layer, wherein the N is an integer equal to 2, and wherein the optical network layer of the first basic component is further configured to:
    parse the first optical signal to know a subcomponent which is the destination of the first optical signal when the optical network layer of the first basic component determines that the destination of the first optical signal is the first basic component; and
    transmit the first optical signal to an optical receiving subcomponent corresponding to the subcomponent which is the destination of the first optical signal.

17. An optical interconnection method applied to an optical interconnection system, wherein the optical interconnection system comprises:
    two or more basic components,
    wherein the basic components comprise a first basic component and a second basic component,
    wherein the first basic component comprises a first optical network layer and a first electrical layer,
    wherein the second basic component comprises a second optical network layer and a second electrical layer, and wherein the method comprises:
        sending, by the first electrical layer, an electrical signal to the first optical network layer, wherein a destination of the electrical signal is the second electrical layer;
        receiving, by the first optical network layer, the electrical signal;
        converting the electrical signal into an optical signal;
        sending the optical signal to the second optical network layer;
        receiving, by the second optical network layer, the optical signal;
        converting the optical signal into the electrical signal; and
        sending the electrical signal to the second electrical layer.

18. The method according to claim 17, wherein the optical interconnection system further comprises a third basic component, wherein the third basic component is located between the first basic component and the second basic component, wherein the third basic component comprises a third optical network layer and a third electrical layer, and wherein sending the optical signal to the second optical network layer comprises:
    determining, by the first optical network layer according to a band of the optical signal, that a destination of the optical signal is the second basic component; and
    sending the optical signal to the third optical network layer of the third basic component such that the third optical network layer forwards the optical signal to the second optical network layer.

19. The method according to claim 17, wherein the second electrical layer comprises N subcomponents, wherein the N is an integer greater than 2, wherein receiving, by the second optical network layer, the optical signal, wherein converting the optical signal into the electrical signal, and wherein sending the electrical signal to the second electrical layer comprises:
    receiving, by the second optical network layer, the optical signal;
    parsing the optical signal to know a subcomponent that is in the second electrical layer and is a destination of the optical signal;
    converting, by the second optical network layer, the optical signal into the electrical signal; and
    transmitting the electrical signal to the subcomponent that is in the second electrical layer and is the destination of the optical signal.

20. The method according to claim 17, wherein the second electrical layer comprises N subcomponents, wherein the N is an integer equal to 2, wherein receiving, by the second optical network layer, the optical signal, wherein converting the optical signal into the electrical signal, and wherein sending the electrical signal to the second electrical layer comprises:
    receiving, by the second optical network layer, the optical signal;
    parsing the optical signal to know a subcomponent that is in the second electrical layer and is a destination of the optical signal;
    converting, by the second optical network layer, the optical signal into the electrical signal; and
    transmitting the electrical signal to the subcomponent that is in the second electrical layer and is the destination of the optical signal.

* * * * *